US009991862B2

United States Patent
Kim et al.

(10) Patent No.: US 9,991,862 B2
(45) Date of Patent: Jun. 5, 2018

(54) AUDIO SYSTEM EQUALIZING

(71) Applicant: Bose Corporation, Framingham, MA (US)

(72) Inventors: Wontak Kim, Watertown, MA (US); Michael J. Daley, Shewsbury, MA (US); Laszlo Drimusz, Framingham, MA (US); Matthew S. Walsh, Mansfield, MA (US)

(73) Assignee: Bose Corporation, Framingham, MA (US)

( * ) Notice: Subject to any disclaimer, the term of this patent is extended or adjusted under 35 U.S.C. 154(b) by 0 days. days.

(21) Appl. No.: 15/086,962

(22) Filed: Mar. 31, 2016

(65) Prior Publication Data
US 2017/0288625 A1    Oct. 5, 2017

(51) Int. Cl.
| | |
|---|---|
| H04R 29/00 | (2006.01) |
| H03G 5/16 | (2006.01) |
| H04M 1/737 | (2006.01) |
| H04S 7/00 | (2006.01) |

(52) U.S. Cl.
CPC ............ *H03G 5/165* (2013.01); *H04M 1/737* (2013.01); *H04R 29/001* (2013.01); *H04S 7/301* (2013.01); *H04S 7/307* (2013.01); *H04R 2420/07* (2013.01); *H04R 2420/09* (2013.01)

(58) Field of Classification Search
CPC .............. H04R 29/001; H04R 2420/07; H04R 2420/09; H03G 5/165; H04S 7/301; H04S 7/307
USPC ....................................... 381/103, 56, 58–59
See application file for complete search history.

(56) References Cited

U.S. PATENT DOCUMENTS

| | | | |
|---|---|---|---|
| 5,581,621 | A | 12/1996 | Koyama et al. |
| 7,215,787 | B2 | 5/2007 | Sternad et al. |
| 7,483,540 | B2 | 1/2009 | Rabinowitz et al. |
| 7,567,675 | B2 | 7/2009 | Bharitkar et al. |
| 8,005,228 | B2 | 8/2011 | Bharitkar et al. |
| 8,150,047 | B2 | 4/2012 | Rabinowitz et al. |
| 8,194,885 | B2 | 6/2012 | Brannmark et al. |
| 8,213,637 | B2 | 7/2012 | Brannmark et al. |
| 8,233,642 | B2 | 7/2012 | Mao |
| 8,249,260 | B2 | 8/2012 | Tian |

(Continued)

FOREIGN PATENT DOCUMENTS

| | | |
|---|---|---|
| EP | 1578170 A2 | 3/2005 |
| WO | 2011139502 A1 | 11/2011 |
| WO | 2015108794 A1 | 7/2015 |

OTHER PUBLICATIONS

The International Search Report and The Written Opinion of the International Searching Authority dated Jun. 12, 2017 for PCT Application No. PCT/US2017/024958.

*Primary Examiner* — Disler Paul
(74) *Attorney, Agent, or Firm* — Brian M. Dingman; Dingman IP Law, PC

(57) ABSTRACT

Processes and devices for equalizing an audio system that is adapted to use a loudspeaker to transduce test audio signals into test sounds. The processes and devices can involve the use of infrared signals to convey information in one or both directions between the audio system and a portable computer device that captures test sounds, calculates audio parameters that can be used in the equalization process, and transmits these audio parameters back to the audio system for its use in equalizing audio signals that are played by the audio system.

17 Claims, 2 Drawing Sheets

(56) References Cited

U.S. PATENT DOCUMENTS

| | | |
|---|---|---|
| 8,285,405 B2 | 10/2012 | Goh et al. |
| 8,712,245 B1 | 4/2014 | Alao et al. |
| 8,755,538 B2 | 6/2014 | Kwon |
| 8,947,347 B2 | 2/2015 | Mao et al. |
| 9,014,383 B2 | 4/2015 | Kanishima et al. |
| 9,061,268 B2 | 5/2015 | Fejzo et al. |
| 9,094,768 B2 | 7/2015 | LaBosco |
| 9,106,192 B2 | 8/2015 | Sheen et al. |
| 9,119,012 B2 | 8/2015 | Ikizyan et al. |
| 9,164,724 B2 | 10/2015 | Maling, III et al. |
| 9,300,266 B2 | 3/2016 | Grokop |
| 9,438,996 B2 | 9/2016 | Maher et al. |
| 9,521,487 B2 | 12/2016 | Oishi et al. |
| 9,538,305 B2 | 1/2017 | Lehnert et al. |
| 9,648,422 B2 | 5/2017 | Sheen et al. |
| 9,668,049 B2 | 5/2017 | Wilberding et al. |
| 9,690,271 B2 | 6/2017 | Sheen et al. |
| 9,690,539 B2 | 6/2017 | Sheen et al. |
| 9,693,164 B1 | 6/2017 | Kadri et al. |
| 9,693,165 B2 | 6/2017 | Downing et al. |
| 9,706,323 B2 | 7/2017 | Sheen |
| 9,729,984 B2 * | 8/2017 | Tan .................. H04R 29/00 |
| 9,736,584 B2 | 8/2017 | Sheen |
| 2007/0223732 A1 | 9/2007 | Mao |
| 2009/0110218 A1 | 4/2009 | Swain |
| 2010/0020983 A1 * | 1/2010 | Waites .................. H04R 5/04 381/79 |
| 2012/0057724 A1 | 3/2012 | Rabinowitz et al. |
| 2014/0003625 A1 * | 1/2014 | Sheen .................. H03G 5/005 381/103 |
| 2015/0195666 A1 * | 7/2015 | Massey .............. H04R 29/001 381/59 |
| 2015/0208190 A1 | 7/2015 | Hooks et al. |
| 2016/0011850 A1 | 1/2016 | Sheen et al. |
| 2016/0330562 A1 * | 11/2016 | Crockett .............. H04S 7/301 |
| 2017/0127211 A1 * | 5/2017 | Crockett .............. H04S 7/305 |

* cited by examiner

AUDIO SYSTEM EQUALIZING

BACKGROUND

This disclosure relates to equalizing audio systems.

Audio systems use an audio signal source to generate sound from one or more transducers/loudspeakers. In equalized systems the frequency response is modified so as to provide higher quality sound in the room or listening area in which the audio system is located. For portable audio systems such as wireless speaker packages, the location can easily be changed. Such systems will provide better sound if they are equalized to their environment each time they are moved, or if the environment changes.

SUMMARY

All examples and features mentioned below can be combined in any technically possible way.

In one aspect a dongle that is adapted to be coupled to a portable computer device includes a microphone adapted to detect test sounds radiated by an audio system and an infrared transmitter adapted to transmit infrared signals to the audio system, where the transmitted infrared signals convey to the audio system audio parameters that are based on the detected test sounds.

Embodiments may include one of the following features, or any combination thereof. The audio system may be a wireless speaker package. The transmitted infrared signals may also convey audio system control signals to the audio system. The dongle may also include a digital connector that is adapted to be coupled to the portable computer device. The digital connector may be a USB connector. The dongle may also include an analog connector that is configured to be coupled to the portable computer device. The analog connector may be a plug that is adapted to couple with an analog jack of the portable computer device. The audio parameters may include an equalization pattern that is appropriate to achieve a desired audio system frequency response.

In another aspect a process for equalizing a first audio system that is adapted to use a loudspeaker to transduce test audio signals into test sounds includes capturing test sounds by a remote device, calculating, based on the captured test sounds, information that can be used to achieve a desired frequency response from the first audio system, wirelessly transmitting, by an infrared transmitter that is functionally associated with the remote device, and as a series of infrared signals, the calculated information, receiving, by an infrared receiver that is functionally associated with the first audio system, the transmitted infrared signals, translating, by the first audio system, the received infrared signals into an audio system equalization pattern that is appropriate to achieve a desired frequency response from the first audio system, and saving, in a memory of the first audio system, the speaker package equalization pattern.

Embodiments may include one of the following features, or any combination thereof. The information that can be used to achieve a desired frequency response from the first audio system may be calculated by the remote device, or it may be calculated by a remote device such as a cloud-connected device. The process may also include providing feedback concerning the transmitted infrared signals, by the audio system, via audio played from the loudspeaker. The infrared transmitter may be part of a dongle that is adapted to be coupled to the remote device. The dongle may be adapted to be coupled to the remote device via an analog jack of the remote device. The remote device may be a smartphone or a second audio system, for example. The first and second audio systems may each be a wireless speaker package.

In another aspect, a method that uses a portable computer device that is adapted to communicate with an audio system, where the audio system is adapted to use one or more loudspeakers to transduce audio signals into sound, includes receiving, by a microphone associated with the portable computer device while the portable computer device is at a first location in a listening space, sound from the audio system when the audio system plays test audio signals, determining a time delay between the audio signals and the receipt of the played test audio signals by the microphone, determining, based on the played test audio signals, a frequency response for the first location, and transmitting to the audio system, based on the frequency response, audio parameters that are appropriate to achieve a desired acoustic profile from the one or more loudspeakers of the audio system.

Embodiments may include one of the following features, or any combination thereof. The audio parameters may be calculated by the portable computer device, or the audio parameters may be calculated by a remote computing device and then transmitted to the portable computer device. The information that is based on the frequency response may include one or more audio parameters that are calculated using the determined time delay. Determining a time delay may include correlating the test audio signals and microphone signals. The transmission to the audio system by the portable computer device may be wireless, and may use infrared signals.

DETAILED DESCRIPTION

An audio system can play higher quality sound if it is equalized to its surroundings. For portable audio systems such as wireless speaker packages, the location can easily be changed. Such systems will provide better sound if they are equalized to their environment each time they are moved, or if the environment changes.

Audio system equalization is disclosed in U.S. Pat. No. 7,483,540, the disclosure of which is incorporated herein by reference. The subject patent discloses equalizing an audio system using a portable computer device that is moved to one or more locations in the room. Test sounds radiated by the audio system are received by the portable computer device. An equalization pattern is calculated by the portable computing device from an average room response from the various position responses. The equalization pattern is downloaded to the audio system, which then applies it to the audio signals that are transduced to sound waves.

In the present disclosure, elements of figures are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagrams, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawings.

Figure 1:
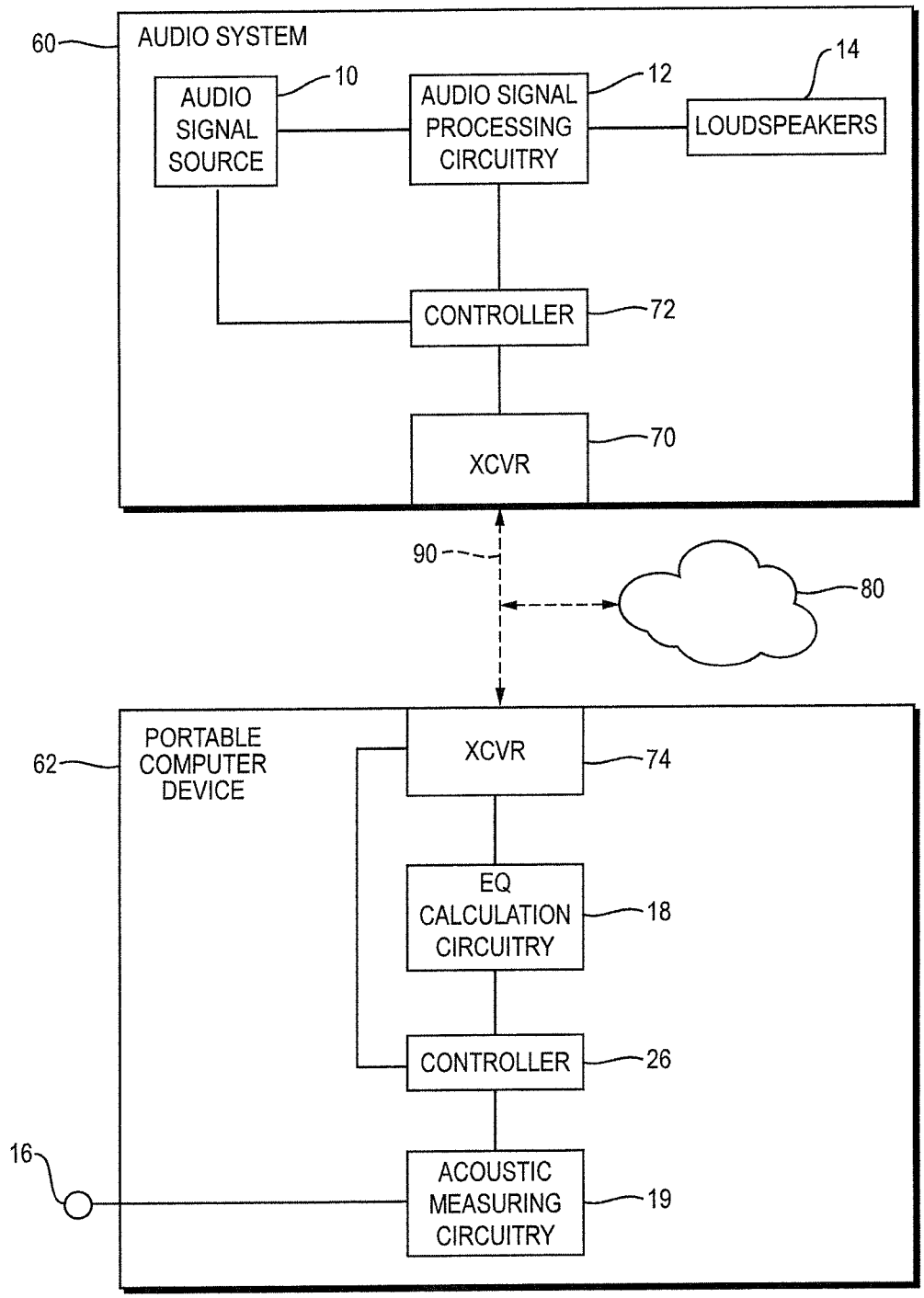
FIG. 1 is schematic block diagram of an audio system and a portable computer device that together can be used to equalize the audio system.

FIG. 1 illustrates a non-limiting example of an audio system 60 and a portable computer device 62 that can be used in the present disclosure. Audio system 60 has audio signal source 10, audio signal processing circuitry 12, and one or more loudspeakers 14. Audio system 60 also includes controller 72 and transceiver 70 that is adapted for bilateral wireless communication with portable computer device 62. In one non-limiting example audio system 60 is a stand-alone, portable wireless speaker package such as the Bose® SoundLink®, available from Bose Corporation, Framingham, Mass. A portable wireless speaker package can use various audio signal sources: for example it can receive audio signals from portable computer device 62 or from an internet radio station, as just two non-limiting examples.

In this non-limiting example, portable computer device 62 has microphone 16, acoustic measuring circuitry 19, controller 26, and equalization calculation circuitry 18. Portable computer device 62 also includes transceiver 74 that accomplishes the communication to and from audio system 60, as depicted by dashed line 90. In one non-limiting example portable computer device 62 is a smartphone with an appropriate software application that is able to command the smartphone to achieve the remote device functionality described herein. One non-limiting example of a smartphone that can be used is the iPhone®, available from Apple Inc., Cupertino, Calif. Many smartphones have a built-in microphone that can be used as microphone 16. If not, a separate microphone can be used and properly coupled to device 62, e.g., via an analog or digital connector. Many smartphones also have processing capability that can be used to accomplish circuitry 19, controller 26, and circuitry 18. If device 62 is used to control or communicate with system 60 in other fashions (e.g., if device 62 separately operates as a remote control for system 60, or if device 62 provides audio signals that are played by system 60), controller 26 can output or input directly from transceiver 74. Many smartphones also include wireless transmit and receive capabilities (e.g., using WiFi, Bluetooth, radio frequency (RF), and/or infrared wireless communications capabilities). Bi-directional wireless communication between audio system 60 and portable computer device 62 can be accomplished by any now-known or later-developed wireless communication technology. The communication can be direct between system 60 and device 62, or it can be indirect such as via a local router or the like, or via the cloud as indicated at 80.

One exemplary, non-limiting process for equalizing audio system 60 involves a person moving portable computer device 62 about the room in which audio system 60 is located, while system 60 plays a series of test tones that are then received by device microphone 16. Instead of test tones, system 60 can play music or pink noise as the test audio that is then received by microphone 16. The audio signals for music or pink noise can in one non-limiting example come from portable computer device 62 and be transmitted to audio system 60 via wifi and a local router. The frequency responses corresponding to the received sounds are then calculated by controller 26 running an appropriate software program of the type known in the art for calculating frequency responses, and/or information that is based on frequency responses and that can be used by audio system 60 to achieve a desired frequency response from loudspeaker(s) 14. Such information that is based on the calculated frequency responses can include audio parameters such as filter coefficients, gains and/or delays that can be used by audio system 60 to produce properly equalized sound from loudspeaker(s) 14. As an alternative to computing the audio parameters by device 62, the computation can be done by a remote computing device as indicated by cloud 80. The computed audio parameters, and/or the information that is based on frequency responses, are then sent to audio system 60 directly from device 62 (via transceiver 74) or indirectly, e.g., via wifi/local router or cloud 80. Audio system 60 saves this information in memory associated with controller 72. This information is then used by audio system 60 to equalize audio it plays via loudspeaker(s) 14.

High quality equalization requires a consistent or known time between generation of the equalization test sound excitation signals by the audio signal source, and receipt of the resulting test sounds by microphone 16. There can be situations in which this timing can be inconsistent. For example, when system 60 and device 62 wirelessly communicate via WiFi and a local router there can be unknown radio delays (e.g., the delay can depend on the state of the network quality at the moment, and the amount of buffering). Also, the acoustic delay depends on the distance between audio system 60 and personal computer device 62, which is unknown and variable. In such situations the calculation of audio parameters that are used to equalize audio system 60 can be improved by correlating the audio signal source with the microphone signals so as to determine the time delay, and then taking the time delay into account when the transfer functions (frequency responses) are calculated. Determining a time delay using correlation between two series is a technique known in the art. Using the determined time delay in the frequency response calculation is also a technique known in the art. Correlation can be accomplished by controller 26. The correlation results can then be used by controller 26 in the calculation of the audio parameters.

Figure 2:
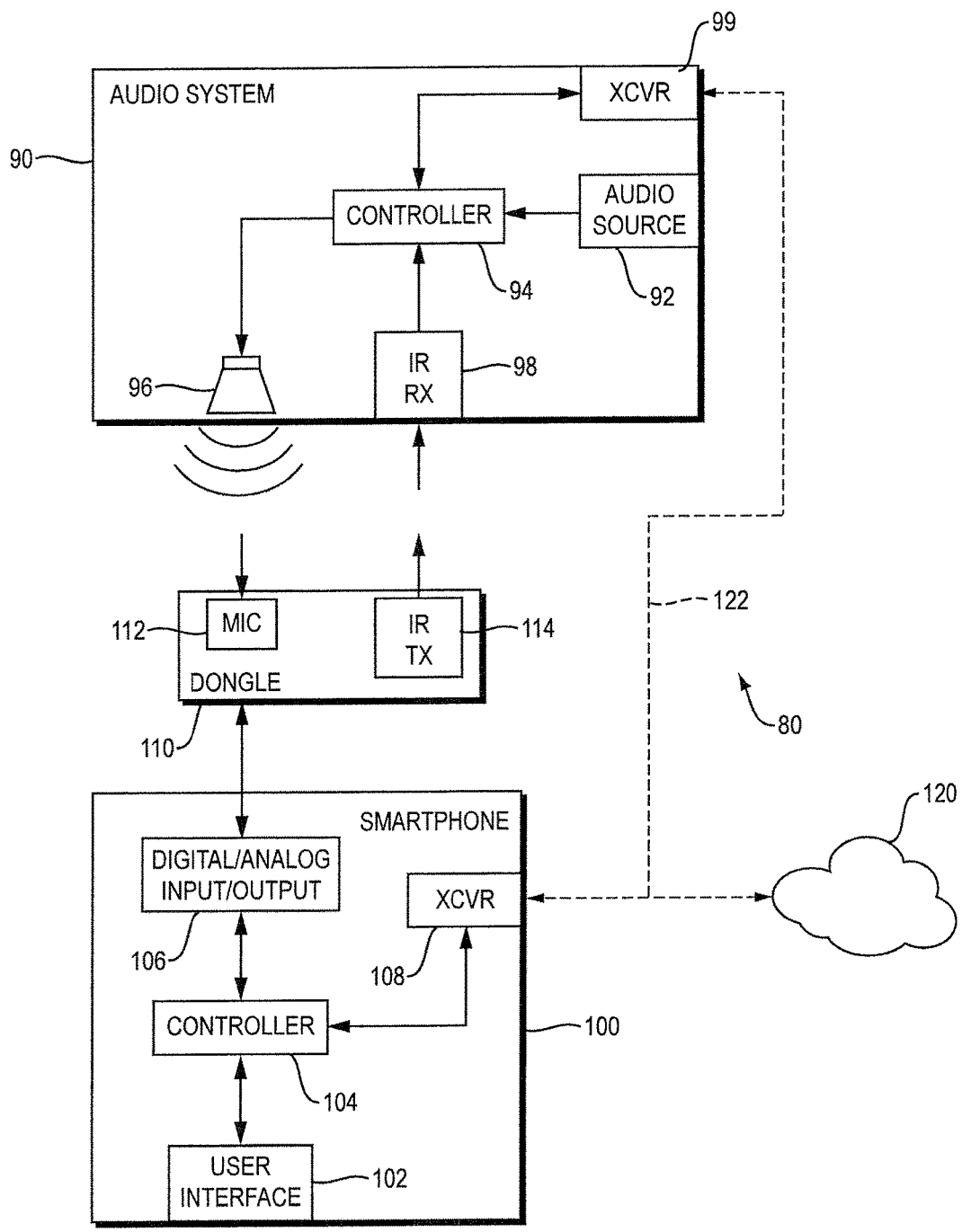
FIG. 2 is schematic block diagram of another audio system and a smart phone with associated dongle that together can be used to equalize the audio system.

FIG. 2 illustrates a second non-limiting example of an audio system 90 and a smartphone 100 that can be used in the present disclosure. Some details of audio system 90 and smartphone 100 that were disclosed relative to audio system 60 and portable computer device 62, FIG. 1, are not discussed in detail relative to FIG. 2, so as to simplify the drawings and description. Audio system 90 has audio signal source 92, controller 94, loudspeaker(s) 96, transceiver 99 and infrared (IR) receiver 98. In one non-limiting example audio system 90 is a stand-alone, portable wireless speaker package such as the Bose® SoundLink®, available from Bose Corporation, Framingham, Mass. Smartphone 100 has digital and/or analog input/output interface 106 (e.g., an audio jack and/or a USB port), controller 104, transceiver 108 and user interface (UI) 102. One non-limiting example of a smartphone that can be used is the iPhone®, available from Apple Inc., Cupertino, Calif., loaded with an appropriate software application that is able to command the smartphone to achieve the functionality described herein.

Dongle 110 is a separate device that is configured to be functionally coupled to smartphone 100 via the smartphone input/output 106. Dongle output signals that are received by smartphone 100 can be analog or digital. Non-limiting examples of electrical interconnection of dongle 110 and smartphone 100 include analog connection via a plug that fits into an analog input jack of smartphone 100, and digital input via a digital connector that fits into a USB port or other digital port of smartphone 100. Dongle 110 can have microphone 112 that functions as a receiver of test tones from audio system 90, although if smartphone 100 includes a microphone then dongle 110 does not need microphone 112. Dongle 110 includes an IR transmitter 114 that is configured to translate smartphone output signals into IR signals that are broadcast into the room and received by audio system IR receiver 98. Alternatively, or additionally, audio system 90 and smartphone 100 can wirelessly communicate as described above relative to FIG. 1 and as illustrated by transceiver 99, transceiver 108, wireless communication 122, and cloud 120. Smartphone output signals that are translated and broadcast as IR by dongle 110 can include but are not limited to audio parameters or information that can be used to achieve a desired frequency response from audio system 90, calculated by smartphone 100 or in the cloud, as described above. Smartphone output signals that are sent as IR signals by dongle 110 can also include audio system control signals such as volume control, internet radio station selection or audio track selection when smartphone 100 is adapted to function as an audio system remote control and dongle 110 adds to the remote control function an IR transmit function that allows audio system control via its IR receiver 98.

As part of the communication scheme between audio system 90 and smartphone 100, audio system 90 can provide to smartphone 100 feedback concerning the transmitted IR signals it has received. This is one way to ensure that the correct information has been transmitted by the smartphone and received by the audio system. The feedback can in one non-limiting example be accomplished via loudspeaker 96. For example, a unique tone or series of tones could be played by audio system 90 to indicate receipt of audio parameters from smartphone 100. Or, acknowledgement information could be sent via transceiver 99. In one example, the smartphone could continue to transmit calculated audio parameters until their receipt was acknowledged by audio system 90 in some manner.

The systems shown in FIGS. 1 and 2 have components and functionality that can be used in manners other than as depicted in the drawings. For example, the IR communication functionality of FIG. 2 can be used in the FIG. 1 system. Also, smartphone 100, FIG. 2, could be replaced by another device (whether portable or not) that was adapted to receive test tones and transmit IR and/or other wireless communications signals. One example of such a device is a second audio system, for example a speaker package (wireless, or not, and portable, or not) that has existing IR transmit capabilities that can be used as IR transmitter 114 and an existing microphone that can be used as microphone 112. In this case, there would be no need for a dongle since the speaker package itself would already include all of the functionality of dongle 110.

Embodiments of the systems and methods described above comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other embodiments are within the scope of the following claims.

What is claimed is:

1. A process for equalizing a first audio system that is adapted to use a transducer to transduce test audio signals into test sounds, where the test audio signals are wirelessly transmitted from a remote audio signal source to the first audio system, the process comprising:
   capturing with a remote device the test sounds that were radiated by the transducer;
   determining a time delay between the audio signal source and the receipt of the test sounds by the remote device, where the time delay includes an unknown radio delay involved in the wireless transmission of the audio signals, and where the time delay is determined by correlating the audio signal source with the receipt of the test sounds by the remote device;
   calculating, based on the both the captured test sounds and the determined time delay, information that can be used to achieve a desired frequency response from the first audio system;
   wirelessly transmitting, by an infrared transmitter that is functionally associated with the remote device, and as a series of infrared signals, the calculated information;
   receiving, by an infrared receiver that is functionally associated with the first audio system, the transmitted infrared signals;
   translating, by the first audio system, the received infrared signals into an audio system equalization pattern that is appropriate to achieve a desired frequency response from the first audio system; and
   saving, in a memory of the first audio system, the audio system equalization pattern.

2. The process of claim 1, wherein the first audio system comprises a wireless speaker package.

3. The process of claim 1, wherein the information that can be used to achieve a desired frequency response from the first audio system is calculated by the remote device.

4. The process of claim 1, further comprising providing feedback concerning the transmitted infrared signals, by the audio system, via audio played from the loudspeaker.

5. The process of claim 1, wherein the infrared transmitter is part of a dongle that is adapted to be coupled to the remote device.

6. The process of claim 5, wherein the dongle is adapted to be coupled to the remote device via an analog jack of the remote device.

7. The process of claim 1, wherein the remote device comprises a smartphone.

8. The process of claim 1, wherein the remote device comprises a second audio system.

9. The process of claim 8, wherein the first and second audio systems each comprise a wireless speaker package.

10. The process of claim 1, wherein the audio signal source is part of the remote device.

11. A method that uses a portable computer device that is adapted to wirelessly communicate with an audio system, where the audio system is adapted to transduce test audio signals into test sounds, the method comprising:

generating test audio signals using an audio signal source;

wirelessly transmitting the test audio signals from the portable computer device to the audio system, where the wireless transmission involves an unknown radio delay;

using the audio system to produce test sounds from the received test audio signals;

receiving, by a microphone associated with the portable computer device while the portable computer device is at a first location in a listening space, the test sounds;

determining a time delay between the generation of the test audio signals, and the receipt of the test sounds by the microphone, where the time delay includes the unknown radio delay and is determined by correlating the generation of the audio signals with the receipt of the test sounds by the microphone;

determining, based on both the received test sounds and the determined time delay, a frequency response for the first location; and transmitting to the audio system, based on the determined frequency response, audio parameters that are appropriate to achieve a desired acoustic profile from the one or more loudspeakers of the audio system.

12. The method of claim 11, wherein the audio parameters are calculated by the portable computer device.

13. The method of claim 11, wherein the audio parameters are calculated by a remote computing device and then transmitted to the portable computer device.

14. The method of claim 11, wherein the audio parameters are calculated using the determined time delay.

15. The method of claim 11, wherein the wireless transmission uses infrared signals.

16. The method of claim 11, wherein the wireless transmission uses WiFi.

17. The method of claim 11, wherein the audio system uses a single transducer to produce the test sounds.

* * * * *